(12) United States Patent
Kojima et al.

(10) Patent No.: US 9,676,608 B2
(45) Date of Patent: Jun. 13, 2017

(54) ELECTRICAL DEVICE INCLUDING A FUNCTIONAL ELEMENT IN A CAVITY

(71) Applicant: KABUSHIKI KAISHA TOSHIBA, Minato-ku (JP)

(72) Inventors: Akihiro Kojima, Yokohama (JP); Yoshiaki Sugizaki, Yokohama (JP); Yoshiaki Shimooka, Machida (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 188 days.

(21) Appl. No.: 14/462,262

(22) Filed: Aug. 18, 2014

(65) Prior Publication Data

US 2014/0353777 A1 Dec. 4, 2014

Related U.S. Application Data

(63) Continuation of application No. 13/647,845, filed on Oct. 9, 2012, now Pat. No. 8,829,359, which is a (Continued)

(30) Foreign Application Priority Data

Jan. 25, 2008 (JP) .................................. 2008-015510
Oct. 31, 2008 (JP) .................................. 2008-282499

(51) Int. Cl.
    *H05K 1/16* (2006.01)
    *B81B 7/00* (2006.01)
    *B81C 1/00* (2006.01)

(52) U.S. Cl.
    CPC ........ *B81B 7/0038* (2013.01); *B81C 1/00476* (2013.01); *B81B 2201/0221* (2013.01); *B81B 2203/04* (2013.01)

(58) Field of Classification Search
    CPC .............. B81B 7/0038; B81B 2203/04; B81B 2201/0221; B81C 1/00476
(Continued)

(56) References Cited

U.S. PATENT DOCUMENTS 4,770,923 A    9/1988    Wasa et al.
5,144,536 A    9/1992    Tsukada et al.
(Continued)

FOREIGN PATENT DOCUMENTS

JP    2005-207959    8/2005
JP    2006-7459    1/2006

OTHER PUBLICATIONS

J. L. Pornin, et al., "Wafer Level Thin Film Encapsulation for BAW RF MEMS", Electronic Components and Technology Conference, 2007, pp. 605-609.
(Continued)

*Primary Examiner* — Tremesha S Willis
(74) *Attorney, Agent, or Firm* — Oblon, McClelland, Maier & Neustadt, L.L.P.

(57) ABSTRACT

A substrate includes a functional element. An insulating first film forms a cavity which stores the functional element, together with the substrate, and includes a plurality of through-holes. An insulating second film covers the plurality of through-holes, is formed on the first film, and has a gas permeability which is higher than that of the first film. An insulating third film is formed on the second film and has a gas permeability which is lower than the second film. An insulating fourth film is formed on the third film and has an elasticity which is larger than the third film.

37 Claims, 10 Drawing Sheets

Related U.S. Application Data continuation of application No. 12/358,869, filed on Jan. 23, 2009, now Pat. No. 8,309,858.

(58) Field of Classification Search
USPC .................. 174/260, 250, 255, 256, 258
See application file for complete search history.

(56) References Cited

U.S. PATENT DOCUMENTS

| | | |
|---|---|---|
| 5,589,082 A | 12/1996 | Lin et al. |
| 6,747,356 B2 | 6/2004 | Ando et al. |
| 6,936,494 B2 | 8/2005 | Cheung |
| 7,008,812 B1 | 3/2006 | Carley |
| 7,129,420 B2 | 10/2006 | Hashimoto |
| 7,145,213 B1 | 12/2006 | Ebel et al. |
| 7,492,019 B2 | 2/2009 | Carley |
| 7,855,342 B2 | 12/2010 | Sakamoto et al. |
| 8,004,053 B2 | 8/2011 | Miyagi et al. |
| 8,174,027 B2 | 5/2012 | Kojima et al. |
| 8,389,867 B2 | 3/2013 | Enomoto et al. |
| 2004/0094799 A1 | 5/2004 | Nakamura |
| 2004/0248344 A1 | 12/2004 | Partridge et al. |
| 2006/0012028 A1 | 1/2006 | Usui et al. |
| 2006/0040110 A1 | 2/2006 | Kohmura et al. |
| 2007/0158769 A1 | 7/2007 | You |
| 2007/0249082 A1 | 10/2007 | Hanaoka et al. |
| 2008/0006910 A1 | 1/2008 | Miyata et al. |
| 2008/0274576 A1 | 11/2008 | Enomoto et al. |
| 2010/0187502 A1 | 7/2010 | Gambino et al. |

OTHER PUBLICATIONS

David I. Forehand, et al., "Wafer Level Micropackaging for RF MEMS Switches", Proceedings of IPACK, ASME Interpack, Jul. 17-22, 2005, pp. 1-5.

Chinese Office Action mailed on Jun. 10, 2014 in corresponding China application No. 201110253951.6, with English translation, 11 pages.

Office Action issued Oct. 22, 2013, in Chinese Patent Application No. 201110253951.6 with English translation.

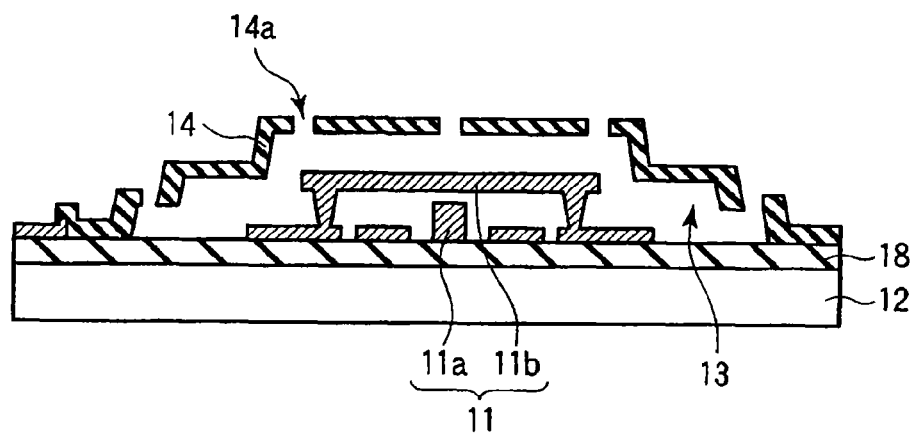
F I G. 3A
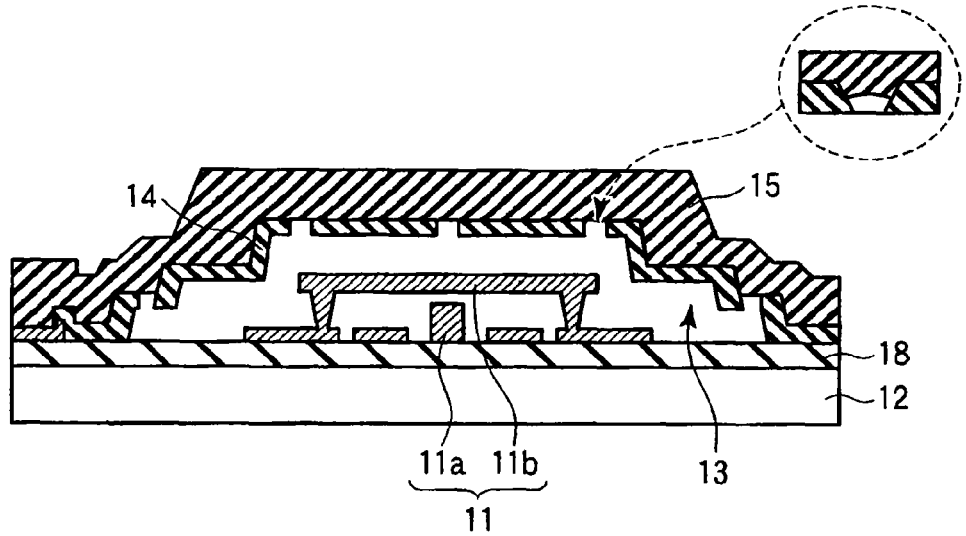
F I G. 3B
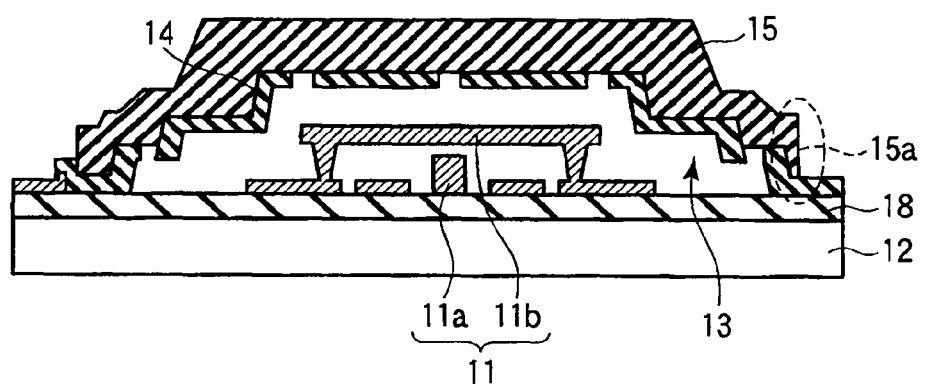
F I G. 3C

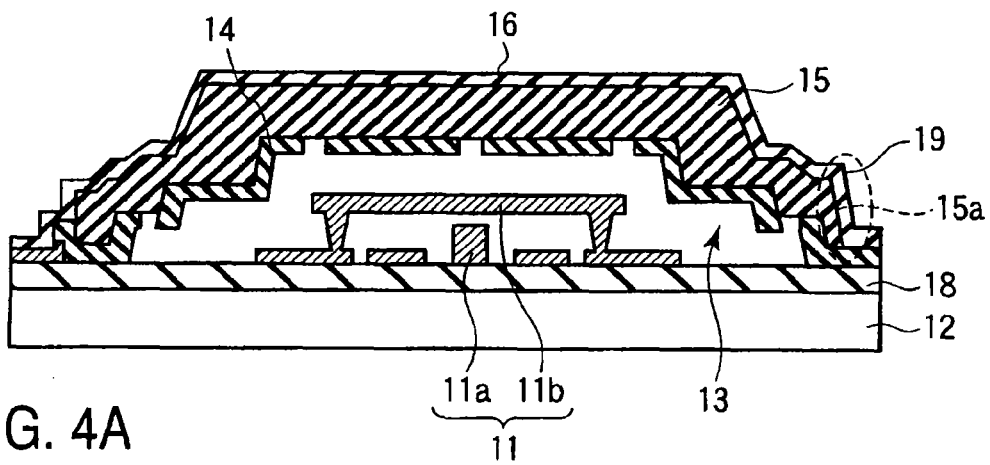
F I G. 4A
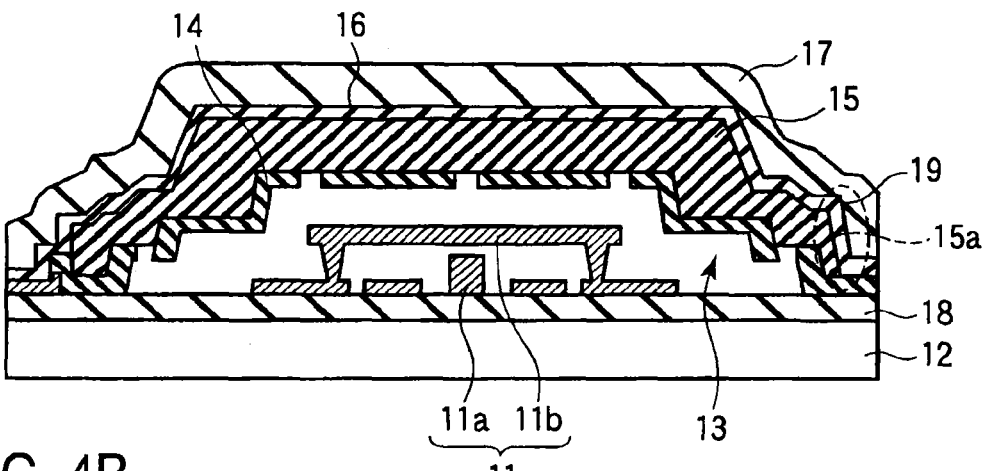
F I G. 4B
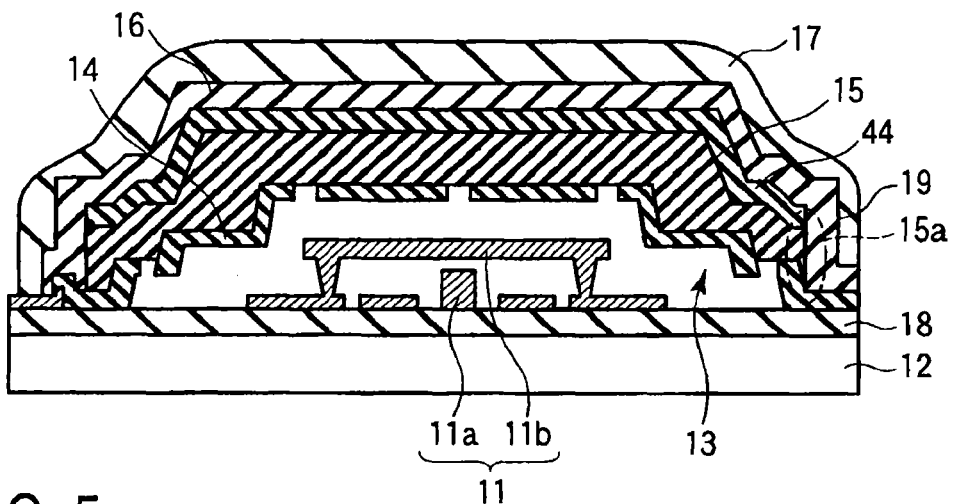
F I G. 5

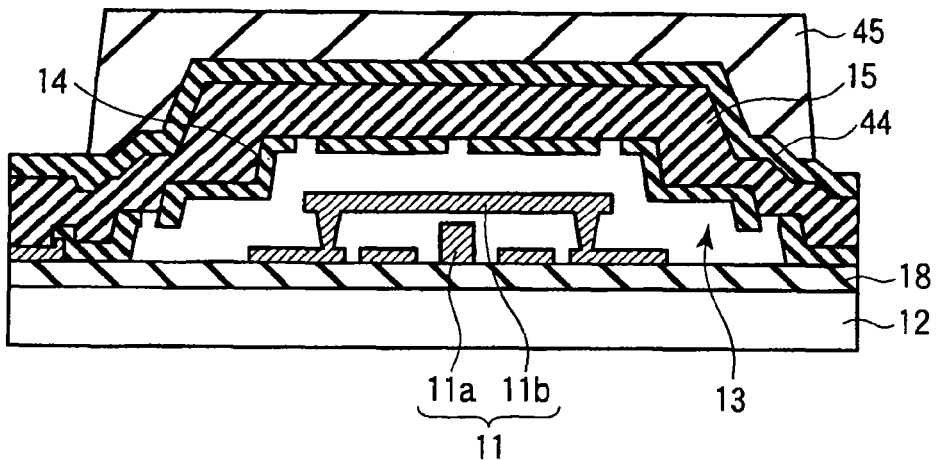
F I G. 6A
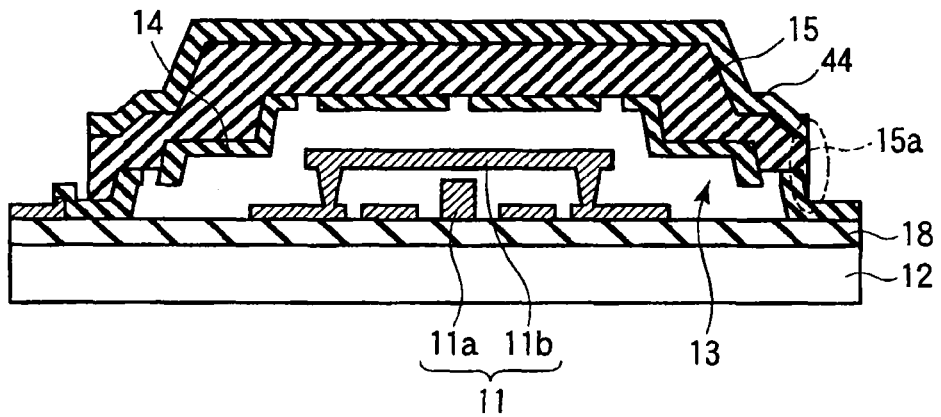
F I G. 6B
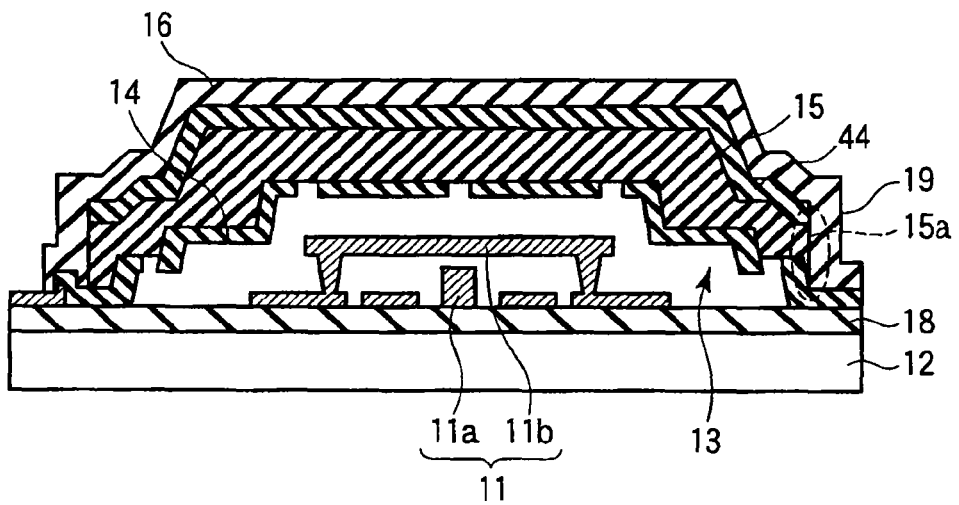
F I G. 6C

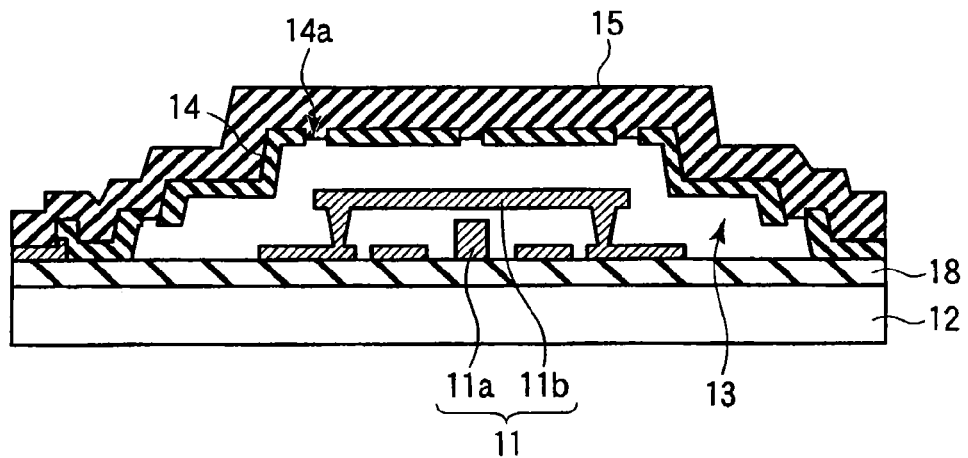
F I G. 7A
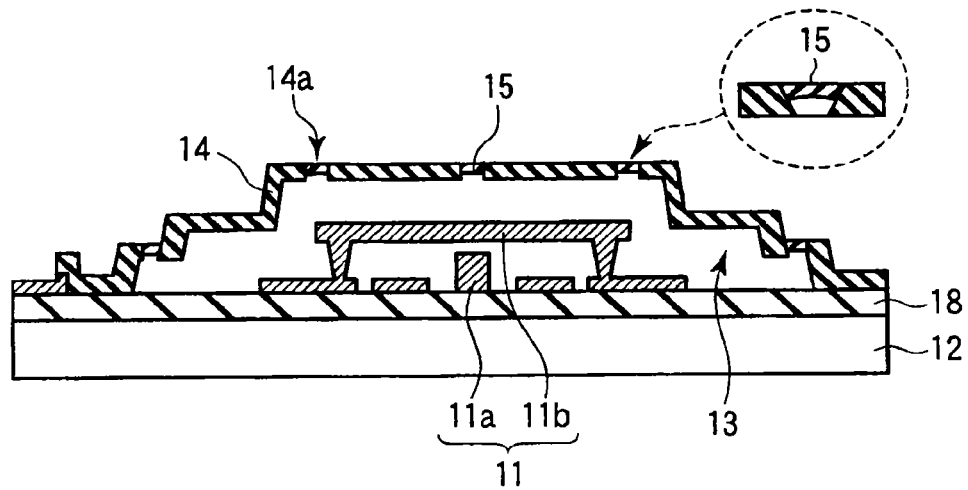
F I G. 7B
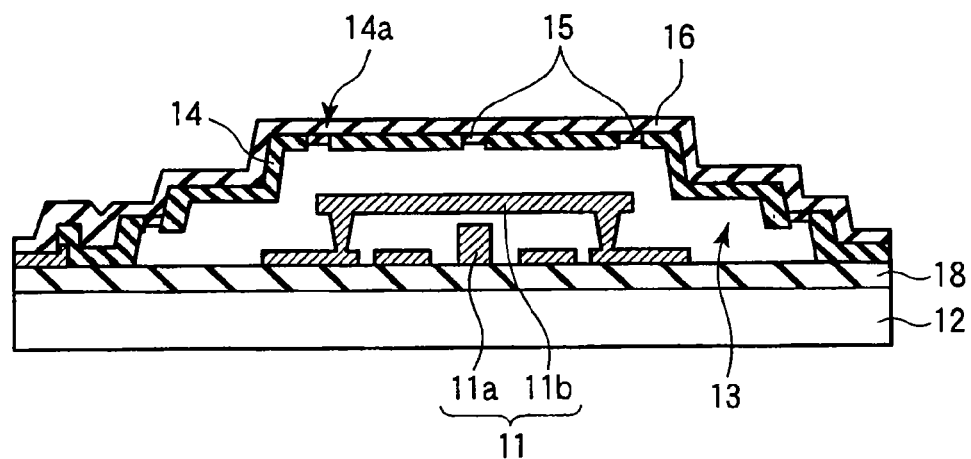
F I G. 7C

| | Young's modulus (Gpa) | Coefficient of thermal expansion(CTE)(ppm) |
|---|---|---|
| SiN | 240.0 | 2.8 |
| SiO | 76.0 | 0.5 |
| Epoxy resin | 3.2 | 50.0 |

ELECTRICAL DEVICE INCLUDING A FUNCTIONAL ELEMENT IN A CAVITY

CROSS-REFERENCE TO RELATED APPLICATIONS

This continuation application claims the benefit of priority under 35 U.S.C. §120 from prior U.S. patent application Ser. No. 13/647,845, filed on Oct. 9, 2012, and U.S. patent application Ser. No. 12/358,869, filed Jan. 23, 2009 (now U.S. Pat. No. 8,309,858, issued Nov. 13, 2012). This application is also based upon and claims the benefit of priority from prior Japanese Patent Applications No. 2008-015510, filed Jan. 25, 2008; and No. 2008-282499, filed Oct. 31, 2008. The entire contents of each of these applications are incorporated herein by reference.

BACKGROUND OF THE INVENTION

1. Field of the Invention

Since a micro electro mechanical system (MEMS) is a functional element having a movable part, the MEMS needs a cavity as an operation space for the movable part, and the cavity is airtightly sealed so as to prevent the intrusion of outside air and protect the functional element.

2. Description of the Related Art

A functional element which is airtightly sealed in a cavity formed by etching a sacrificial film on a substrate has been known. As regards the functional element disclosed in JP 2006-7459, a functional element on a silicon substrate is covered with a sacrificial film, and an etching-resistant film having an opening on the sacrificial film is formed. Etching the sacrificial film through the opening forms the cavity by means of the sacrificial film, and the functional element is stored in the cavity. After this, since a silicon nitride film is formed on the sacrificial film, the opening is sealed, and then the inside of the cavity is airtightly sealed.

However, in the technique disclosed in JP 2006-7459, since the silicon nitride film has strong compression force to a Si substrate, an etching-resistant film forming a cavity is deformed, and the cavity deforms with time.

The stress of the film is lowered by thinning a silicon nitride film to be used in the sealing the opening. However, in a case where the silicon nitride film is thinned, it is needed to make the size of the opening sufficiently small so as to prevent the silicon nitride film dropping into the cavity from the opening and to seal the opening. Therefore, the technique has a problem that it takes a long time to remove the sacrificial film from the small opening and that the sacrificial film remains in the cavity due to a shortage of etching. Thus, an electrical device with a higher reliability has been desired.

BRIEF SUMMARY OF THE INVENTION

According to a first aspect of the invention, an electrical device may include a substrate including a functional element; an insulating first film configured to form a cavity containing the functional element, together with the substrate, and to include a plurality of through-holes; an insulating second film configured to cover the plurality of the through-holes, the second film being formed on the first film and having a gas permeability higher than that of the first film; an insulating third film configured to form at least on the second film, the third film having a gas permeability lower than that of the second film; and an insulating fourth film configured to form on the third film, the fourth film having an elasticity higher than that of the third film.

According to a second aspect of the invention, a electrical device may include a substrate including a functional element; an insulating first film configured to form on the substrate, the insulating first film forming a cavity containing the functional element and including a plurality of through-holes; an insulating second film configured to form in the through-holes, the second film covering each of the plurality of the through-holes and having a gas permeability higher than that of the first film; an insulating third film configured to form on the first and the second films, the third film having a gas permeability lower than that of the second film; and an insulating fourth film configured to form on the third film, the fourth film having an elasticity higher than that of the third film.

According to a third aspect of the invention, a method of an electrical device may include forming an insulating first film having a plurality of through-holes on a substrate with a functional element, the first film forming a cavity which contains the functional element, together with the substrate; forming an insulating second film on the first film to cover the plurality of the through-holes, the second film having a gas permeability higher than that of the first film; discharging water vapor in the cavity to outside of the second film after formation of the second film; forming an insulating third film on the second film after discharging the water vapor, the third film having a gas permeability lower than that of the second film; and forming an insulating fourth film on the third film, the fourth film having an elasticity higher than that of the third film.

BRIEF DESCRIPTION OF THE SEVERAL VIEWS OF THE DRAWING

FIGS. 2A-2D, FIGS. 3A-3C, and FIGS. 4A and 4B are cross-sectional views depicting in turn principles of manufacturing processes of the electrical devices of the first embodiment;

FIG. 5 is a cross-sectional view depicting a principle of a manufacturing process of an electrical device of a modified example of the first embodiment;

FIGS. 6A-6C are cross-sectional views depicting in turn principles of manufacturing processes of electrical devices of the modified example of the first embodiment;

FIGS. 7A-7C are cross-sectional views depicting in turn principles of manufacturing processes of electrical devices of a second embodiment;

DETAILED DESCRIPTION OF THE INVENTION

Hereinafter, embodiments of the invention will be described with reference to the drawings.

First Embodiment

Figure 1:
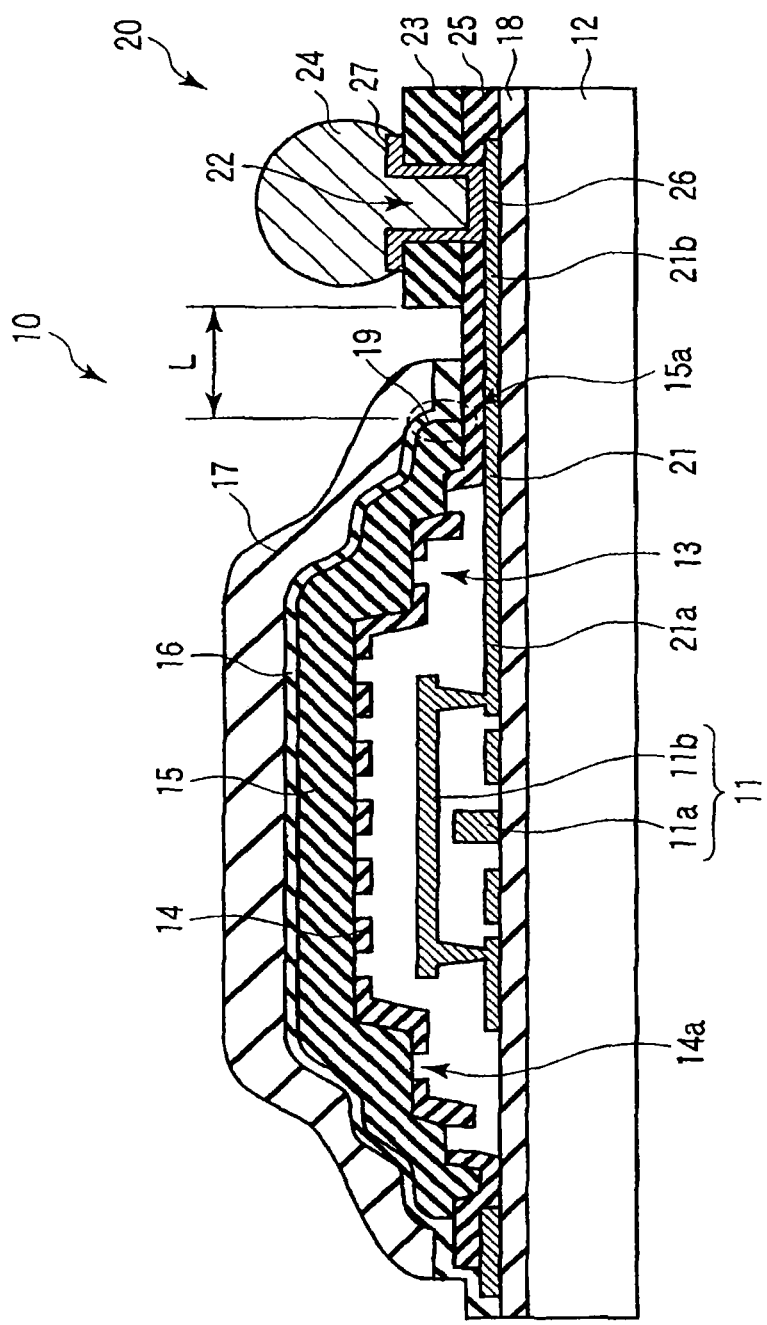
FIG. 1 is a cross-sectional view depicting an electrical device of a first embodiment of the invention.

An electrical device of a first embodiment of the invention will be described with reference to FIG. 1 to FIGS. 4A and 4B. FIG. 1 shows cross sectional views illustrating the electrical devices, and FIGS. 2A, 2B, 2C and 2D to FIGS. 4A and 4B show cross-sectional views illustrating in turn principles of manufacturing processes of the electrical device.

As shown in FIG. 1, an electrical device 10 is composed of a substrate 12 having a functional element 11; an insulating first film 14 which forms a cavity 13 containing the functional element 11, together with the substrate 12, and has a plurality of through-holes 14a; and an insulating second film 15 which is formed on the first film 14 by covering upper surfaces of the plurality of through-holes 14a and has a gas permeability higher than that of the first film 14.

Further, the device 10 is composed of an insulating third film 16 which is formed on the second film 15 and has a gas permeability smaller than that of the second film 15; and an insulating fourth film 17 which is formed on the third film 16 and has an elasticity larger than the third film 16.

The substrate 12 is, for example, a silicon substrate, and an insulating film 18 on the substrate 12 is, for example, a silicon oxide film. The functional element 11 is formed on the insulating film 18. The functional element 11 is, for example, an electrostatic-drive-type MEMS variable-capacitance capacitor.

The MEMS variable-capacitance capacitor is, for example, composed of a first electrode 11a made of aluminum and a second electrode 11b made of aluminum facing the first electrode 11a. When a voltage is applied between the first and the second electrodes 11a, 11b, the capacity of the variable-capacitance capacitor is varied because the distance between the first and the second electrodes 11a, 11b varies due to an electrostatic force.

The cavity is an area for securing an operation space of the functional element 11. The interior of the cavity 13 is maintained at a dry atmosphere or at an evacuated atmosphere. Thereby, the deterioration of the first and the second electrodes 11a, 11b made of aluminum by a harmful gas, for example, water vapor (moisture) is prevented, and the characteristic deterioration of the MEMS variable capacity capacitor is prevented. In the embodiment, aluminum is used for an electrode material as an example. However it is desirable, for reducing a phenomenon of a gradual creep, resulting from plastic deformation accompanied by an improvement of electrical reliability and an increase in the number of times of operations, to use an aluminum alloy containing copper (Cu).

The first film 14 is a silicon compound consisting mainly of Si—O bonds, for example, a silicon oxide film with a thickness of around 1 μm, and an inorganic film as a cap for protecting the device 11 from the outside.

The plurality of through-holes (openings) 14a of the first film 14 form the cavity 13 by removing a sacrificial layer through etching after forming the element 11, as mentioned below. That is, the sacrificial layer is etched through the through-holes 14a.

The second film 15 is an organic layer, for example, an ultraviolet-curable resin consisting mainly of carbon, and more specifically, a resin film composed of a prepolymer, a monomer, a photo polymerization initiator, an additive agent, etc. The second film 15, as described later, coats the first film 14 by covering the upper surfaces of the through-holes 14a after forming the cavity 13. Further, the second film 15 has a function of discharging the harmful gas in the cavity 13 to adjust the atmosphere in the cavity 13.

Therefore, it is preferable for the gas permeability of the second film 15 to be higher than that of the first film 14 and higher in response to the interior capacity of the cavity 13 so that the harmful gas such as water vapor is discharged in a short time from the cavity 13.

That is, if it is assumed that the size of the cavity 13 storing the functional element 11 as represented by the MEMS is, for example, about 2×2×0.04 mm, it is desirable from a practical standpoint for the gas permeability, for example, as regards the water vapor permeability of the second film 15, to be higher than $1 \times 10^{-15}$ m$^2$/s.

The third film 16 is an inorganic film coating the upper surface of the second film 15. The third film 16 is a silicon compound consisting mainly of Si—N bonds, with a gas permeability which is lower than that of the second film 15, for example, a silicon nitride film, and prevents intrusion of the harmful gas such as water vapor into the cavity 13 by penetrating the second film 15.

The silicon nitride film is a fine film, its gas permeability is very low, and the permeability of a gas through a thin film, for example, with a thickness which is thinner than 1 μm, is negligible.

The film stress of the silicon nitride film is large with 1.5 GPa degree. Therefore, to prevent the temporal deformation of the first film 14 due to film stress, it is desirable for the film thickness of the silicon nitride film to be set to 0.3 μm or less. To secure a film quality without any pinholes, etc., it is desirable for the film thickness of the silicon nitride film to be set 0.1 μm or more.

Further, the whole periphery of a side surface 15a of the second film 15 is covered with an insulating fifth film 19 having a gas permeability lower than that of the second film 15. The fifth film 19 is a film made of the same material as that of, for example, the third film 16. Therefore, the device 10 may prevent intrusion of a harmful gas such as water vapor into the film from the side surface 15a of the second film 15 to intrude into the cavity 13 by introducing the fifth film 19.

The fourth film 17 is an organic film, for example, an epoxy resin, reinforces a mechanical strength of a cavity structure having the first to third films 14, 15, 16, prevents the silicon nitride film from being cracked by a thermal stress, and secures thermal stability.

An electrode unit 20 for electrically connecting the functional element 11 to the exterior is formed outside the second film 15. The electrode unit 20 is composed of a wiring 21, an organic film 23, a bump 24, an insulating film 25, an electrode pad 26, and a metallic film 27.

More specifically, one end 21a of the wiring 21 is connected to the functional element 11, the other end 21b is extended outside the second film 15 along the substrate 12, and constitutes the electrode pad 26. The wiring 21 is made of, for example, aluminum, and is formed on the insulating film 18.

The other end 21b of the wiring 21 is covered with the insulating film 25. The film 25 is, for example, a silicon oxide film which is continuous to the first film 14.

The organic film 23 is separated from the second film 15 by a distance L and formed on the insulating film 25. The organic film 23 is, for example, the same ultraviolet-curable resin as the second film 15. The organic film 23 and the insulating film 14 have an opening 22 corresponding to the electrode pad 26.

The metallic film 27, called an under bump metal (UBM), is formed on the electrode pad 26 in the opening 22, and on the organic film 23 of an inner wall surface of the opening 22 and surroundings of the opening 22. The metallic film 27 is a layered film, for example, of a nickel alloy and gold. The bump 24 is formed on the metallic film 27 inside and the periphery of the opening 22 in an overlap manner.

The metallic film 27 is formed so as to enhance the adhesiveness between the electrode pad 26 and the bump 24, for example, made of a solder ball. That is, because an electrode pad 26 made of aluminum has a poor wetting property with a bump 24 made of solder ball, it is hard to directly bond the electrode pad 26 to the solder ball.

The wiring (not shown) connected to the first electrode 11a of the device 11 has the same composition as that of the wiring 21, thus a description thereof will be omitted.

According to the electrical device shown in FIG. 1, the second film 15 having a higher gas permeability covering the upper surfaces of the through-holes 14a is a coating-type organic film. Thereby, even if the size (the diameter or the opening area) of each through-hole 14a is large, the second film 15 may surely seal each through-hole 14a.

Accordingly, since the sizes and arrangement of the through-holes 14a are not restricted, a plurality of arrangements of the through-holes 14a with large sizes enable surely etching the sacrificial film given below in a short time.

Since the third film 16 which is formed on the second film 15 and has a low gas permeability is a thin silicon nitride film, the device 10 may prevent intrusion of the harmful gas such as water vapor into the cavity 13. Moreover, since the third film 16 has a small film stress, the device 10 may prevent the first film 14 from being deformed by the film stress of the silicon nitride film.

Further, since the fourth film 17 having large elasticity covers the thin silicon nitride film, the device 10 may increase the mechanical strength of the cavity structure and secure the thermal stability.

The side surface 15a of the second film 15 having a high gas permeability is covered with the fifth film 19 having the same low gas permeability as that of the third film 16. Thereby, there is little possibility that the harmful gas such as water vapor intrudes into the cavity 13 from the side surface 15a. Therefore, to prevent the intrusion of the harmful gas such as water vapor into the cavity 13, it is not needed to form the organic film 23 of the same kind as that of the second film 15 to be continuous to the second film 15. Therefore, in a case in which a crack is produced from an edge of the metallic film 27 overlapping the organic film 23 to the organic film 23, the device 10 may prevent the intrusion of the harmful gas such as water vapor to diffuse the gas from the organic film 23 into the second film 15 and the intrusion of the gas into the cavity 13. In another aspect, when the second film 15 and the organic film 23 are made of the same material, it is preferable that the second film 15 and the organic film 23 are not continuous. If the second film 15 and the organic film 23 are not separated as in FIG. 1, cracks generated below the bump 24 may be extended toward the cavity 13. Thus, the second film 15 is not continuous to the organic film 23, and more preferably, exposed side surface 15a is covered with the fifth film 19.

A manufacturing method of the electrical device 10 will be described with reference to FIGS. 2A, 2B, 2C and 2D to FIGS. 4A and 4B.

Figure 2A:
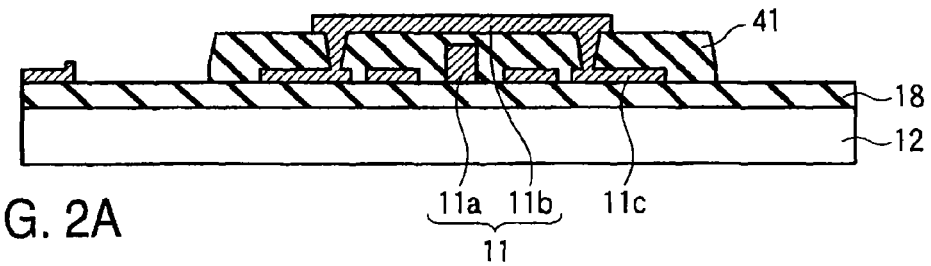

As shown in FIG. 2A, at first, an aluminum film is formed on the insulating film 18 of the substrate 12. The aluminum film is patterned using a photolithography method, and the first electrode 11a of the element 11 and a part 11c of the bridge-shape second electrode 11b are formed.

A protective film (not shown) of a sacrificial layer etching described below is formed on the insulating film 18 including the upper surface and the side surface of the first electrode 11a and the part 11c of the second electrode 11b. The protective film is a layered film, for example, of a silicon nitride film having a thickness of 200 nm and an aluminum film of a thickness of 8 nm.

A first sacrificial film 41 covering the first electrode 11a and the part 11c of the second electrode 11b and having an opening at a position corresponding to a leg part of the second electrode 11b is formed. The first sacrificial film 41 is, for example, a polyimide film with a thickness of about 10 μm.

An aluminum film is formed on the first sacrificial film 41, the aluminum film is patterned in the photolithography method, and the bridge-shape second electrode 11b is formed. The size of the second electrode 11b is, for example, around 2 μm×1200 μm.

Figure 2B:
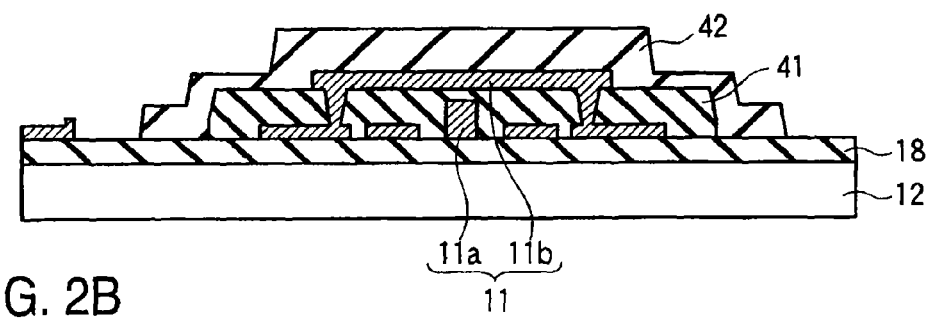

As shown in FIG. 2B, polyimide is coated again, and then, a polyimide film to be a second sacrificial film 42 is formed. A resist film (not shown) is formed on the polyimide film so as to cover an element forming part. Using the resist film as a mask, the polyimide film is etched, for example, using a reactive ion etching (RIE) method, and the second sacrificial film 42 of a thickness, for example, of 6 μm is formed. A selective ratio between the resist film and the second sacrificial film 42 composed of the polyimide film is, for example, 1.5-2.0. Thereby, the vicinity of the functional element 11 is covered with the first and the second sacrificial films 41, 42. For patterning the second sacrificial film 42, a photosensitive material may be used. However, in such a case, the pattern edge becomes sharply-angled due to curing and contraction caused by an exposure process, which results in the introduction of cracks on the insulating film to be formed on the second sacrificial film 42. Therefore, as mentioned above, it is preferable to perform patterning by using the resist film as a mask.

Figure 2C:
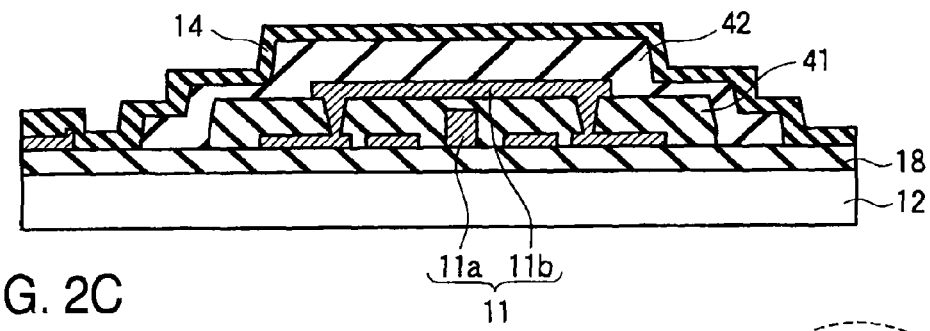

As shown in FIG. 2C, an undoped silicon oxide film of a thickness of 1 μm is formed as the first film 14, for example, in a chemical vapor deposition (CVD) method on a structure produced as the foregoing processing result. Thereby, the outside of the second sacrificial film 42 is covered with the first film 14.

Figure 2D:
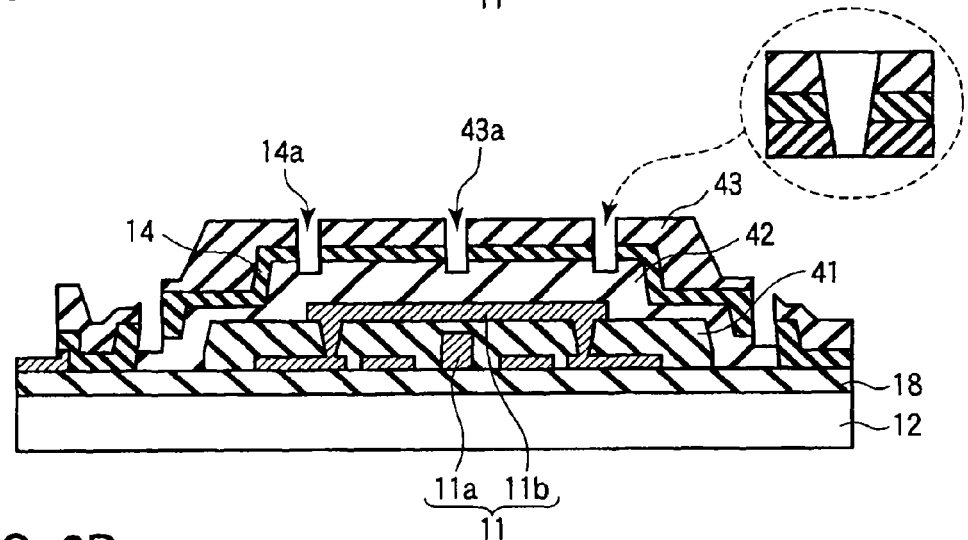

On the first film 14, as shown FIG. 2D, a resist film 43 having a plurality of openings 43a of each of which the diameters is, for example, about 10 μm is formed. Using the resist film 43 as a mask, for example, in the RIE method, a plurality of through-holes 14a are formed.

At this time, it is desirable for the shape of through-holes 14a to have a gradually increased diameter from the side of the second sacrificial film 42 toward the side of the resist film 43 by adjusting the selective ratio between the resist film 43 and the first film 14. In other words, it is desirable for such through holes to have a taper shape in which the diameter gradually decreases from the side of the resist film 43 toward the side of the second sacrificial film 42 by adjusting the selective ratio between the resist film 43 and the first film 14.

This is the reason improves the sealing characteristics of the through-holes 14a after removing the below mentioned first and second sacrificial films 41, 42.

As shown in FIG. 3A, after the resist film 43 is peeled off by using, for example, an asher, the first and the second sacrificial films 41, 42 are etched through the through-holes 14a. This etching is performed by plasma processing for about 15 minutes at a substrate temperature of 150° C. by using a mixed gas, for example, of oxygen ($O_2$) and $CF_4$. The removal of the first and the second sacrificial films 41, 42 may be performed not only by the foregoing dry etching but also by applying wet etching using a chemical liquid.

Thereby, the cavity 13 with the functional element 11 stored therein is formed by the substrate 12 and the insulating first film 14 having the plurality of through-holes 14a.

As shown in FIG. 3B, an ultraviolet-curable epoxy resin is applied as a photosensitive material to the structure produced as the result of the foregoing processing. The viscosity of the ultraviolet-curable epoxy resin is around 2,000-3,000 cp. Therefore, in a case where the film thickness of the first film 14 is 1 μm, and the diameter of each through-hole 14a is 10 μm, even when an epoxy resin of a thickness of 10 μm is formed on the first film 14, there is no possibility of intrusion of the epoxy resin into the cavity 13 from the through-holes 14a.

After this, using photolithography, as shown in FIG. 3C, an ultraviolet ray is irradiated for a short time to the ultraviolet-curable epoxy resin as a photosensitive material to pattern the resin. The resin is hardened by curing the resin, for example, at 200-250° C., and the second film 15 with a thickness of around 10 μm is formed. Thereby, the upper surfaces of the through-holes 14a are covered, and the cavity 13 is sealed. At this moment, the side surface 15a of the second film 15 is exposed.

For instance, by a hot plate, heat processing at en extent of around 150° C.×30 minutes is applied, the water vapor in the cavity 13 removed by penetrating throughout the second film 15 with large gas permeability. Thereby, the atmosphere in the cavity 13 is adjusted, for example, to a humidity not higher than 1%.

After this, as shown in FIG. 4A, the third film 16 is formed on the second film 15 and on the side surface 15a. The third film 16 is, for example, a silicon nitride film ($Si_3N_4$) with a thickness of about 0.3 μm, and is formed in a low-temperature plasma CVD method of about 250-300° C. by using, for example, $SiH_4$ and $NH_3$ as process gases. Thereby, the third film 16 with excellent step coverage is formed.

In this way, the insulating third film 16 having small gas permeability on the second film 15, and the insulating fifth film 19 having a low gas permeability covering the side surface of the second film 15 are formed at the same time, and the cavity 13 is airtightly sealed.

On the third film 16, as shown in FIG. 4B, for example, an epoxy resin, for example, with a thickness of around 100 μm is coated, and cured. Thereby, the third film 16 is protected, and the insulating fourth film 17 having elasticity is formed.

Using a well known method, the electrode unit 20 is formed. For instance, the wiring 21 and the first electrode 11a are formed at the same time, and the insulating film 25 and the first film 14 are formed at the same time. The organic film 23 and the second film 15 are formed at the same time, they are separated from each other by etching, and then the opening 22 is formed. The metallic film 27 is formed using a non-electric-field plating method. After this, the bump 24 thrusting into the metallic film 27 is formed.

In this way, an electrical device 10 in which the functional element 11 is stored in the cavity 13 is completed.

As described above, in the device 10 of the embodiment, the element 11 is stored in the cavity 13 formed by the layered structure of the first film 14; the second film 15 with a gas permeability higher than that of the first film 14; the third film 16 with a gas permeability lower than that of the second film; and the fourth film with an elasticity larger than that of the third film 16.

As a result, the atmosphere in the cavity 13 can be easily adjusted. High airtightness of the cavity 13 may be obtained. Therefore, an electrical device 10 with high reliability may be produced.

While the case in which the first film 14 is a silicon oxide film ($SiO_2$) has been described, another silicon compound having Si—O bonds, such as a Low-k material ($SiO_xC_y$) and a silicon oxide nitride film ($SiO_xN_y$) may be used.

While the case in which the second film 15 having high gas permeability is an ultraviolet-curable epoxy resin has been described, it is possible to use an ultraviolet-curable acrylic resin as a substitute for the ultraviolet-curable epoxy resin. The well known thermosetting-type resin and electron-beam curing-type resin may be, for example, an epoxy acrylate resin, phthalate ester resin, etc.

Further, while the case where the third film 16 having low gas permeability has been a silicon nitride film ($Si_3N_4$), another silicon compound having Si—N bonds, such as a silicon oxide nitride film ($SiO_xN_y$) may be used.

In the case of the use of a silicon oxide nitride film, the third film 16 may be formed at a low temperature of 250-300° C. in plasma CVD using, for example, $SiH_4$, $NH_3$ and $N_2O$ as process gases.

Further, a silicon carbide film (SiC), Aluminum oxide film ($Al_2O_3$), or an aluminum nitride film (AlN) may be adopted for use as the third film 16.

If a silicon carbide film is used as the third film 16, it is possible to form the third film 16 at a low temperature of 250-300° C. in plasma CVD using, for example, $SiH_4$ and $CH_4$ as process gases.

While the case of forming of the third film 16 in plasma CVD has been described, it is also possible to form the third film 16 in a sputtering method or a vacuum evaporation method.

Since the sputtering method or the vacuum evaporation method may not accurately perform step coverage at a part to be shielded, it is needed to uniformly form the third film 16 as a whole while rotating the substrate 12 by a planetary system.

Since it is not needed to heat the substrate, the sputtering method or the vacuum evaporation method has an advantage in that it may be used to form the third film 16 at a lower temperature in comparison with the plasma CVD method.

The fourth film 17 having a large elasticity is not limited to an epoxy resin, and a polyimide resin can be used.

While the case where the third film 16 and the fifth film 19 are formed at the same time has been described, they may be formed individually.

If the influence due to the harmful gas such as water vapor intruding from the side surface 15a of the second film 15 can be avoided, the fifth film 19 may be omitted.

While a method by heating in the case of removing the water vapor in the cavity 13 has been described, the invention is not limited to this method, and it is possible to store the cavity 13 in a container the inside of which is adjusted to a low-humidity atmosphere by means of a dried gas, and remove the water vapor in the cavity 13 in accordance with a partial pressure difference.

It is also able to discharge a gas from the cavity 13 and maintain the interior of the cavity 13 in a vacuum atmosphere.

If the inside of the cavity 13 is created in a vacuum atmosphere, a harmful gas other than water vapor, for example, an oxidation gas, a corrosive gas, may be removed from the cavity 13. Thereby, in the use of the electrical device 10, a characteristic deterioration or an occurrence of a failure of the functional element 11 may be prevented.

While the case in which the element 11 is the electrostatic-drive-type MEMS variable-capacitance capacitor has been described, the element 11 is not limited to this case, and it is possible for the element to be a piezoelectric-drive-type MEMS variable-capacitance capacitor. Further, another MEMS, for example, a film bulk acoustic resonator (FBAR) which holds a piezoelectric thin film between a lower electrode and an upper electrode and is formed on a substrate having the recession below a piezoelectric thin film so as not to disturb mechanical vibration may be used as the element 11.

While the case in which the organic film 23 of the same kind as that of the second film 15 is formed on the pad 26 of the electrode unit 20 through the insulating film 25 connected to the first film 14 has been described, the insulating film 25 may be omitted.

Modified Example

FIGS. 5, 6A, 6B and 6C each show a modified example of the first embodiment. In these modified examples, the same components as those of the first embodiment are designated by identical symbols, and only different components will be described.

In the first embodiment, the third insulating film 16 has been formed on the second insulating film 15. Meanwhile, in each modified example, for example, a silicon oxide film 44 is formed between the second insulating film 15 and the third insulating film 16. The oxide film 44 functions as a hard mask for processing the second film 15.

FIGS. 6A, 6B and 6C each show a manufacturing method of the modified example. In the modified example, the same processes as those of FIGS. 2A to 3B of the first embodiment are performed up to the processes of forming the second insulating film 15.

As shown in FIG. 6A, the silicon oxide film 44 having, for example, a thickness of around 2 μm is formed, for example, in the plasma CVD method on the second film 15, and is made of the ultraviolet-curable epoxy resin, for example. A resist film 45 for processing the oxide film 44 is formed on the oxide film 44.

As shown in FIG. 6B, the oxide film 44 is etched, for example, in the RIE method as the resist mask 45. After this, the second film 15, which is outside the cavity 13, is etched and the side surface 15a of the second film 15 is exposed through the plasma processing by using the silicon oxide film 44 as the mask.

After this, as shown in FIG. 6C, a silicon nitride film as the third film 16 is formed on the oxide film 44 and on the exposed side surface 15a of the second film 15. This forming method of the silicon nitride film is the same as that of the first embodiment. Then, in the same way as that of the first embodiment, the fourth film 17 and the electrode unit 20 are formed on the first silicon nitride film.

According to the foregoing modified example, the silicon oxide film 44 is formed as the hard mask for processing the second film 15. Thereby, using the oxide film 44 enables thorough processing of the second film 15. Further, forming the oxide film 44 enables improving the strength of the cavity 13.

Second Embodiment

FIGS. 7A, 7B, 7C and 8 each show a second embodiment. In the second embodiment, the same components as those of the first embodiment are designated by identical symbols, and only different components will be described.

In the first embodiment, the second film 15 has been formed on the entire surface, including the through-holes 14a, of the first film 14. Meanwhile, in the second embodiment, the second films 15 are formed only in the through-holes 14a.

Figures 8, 9:
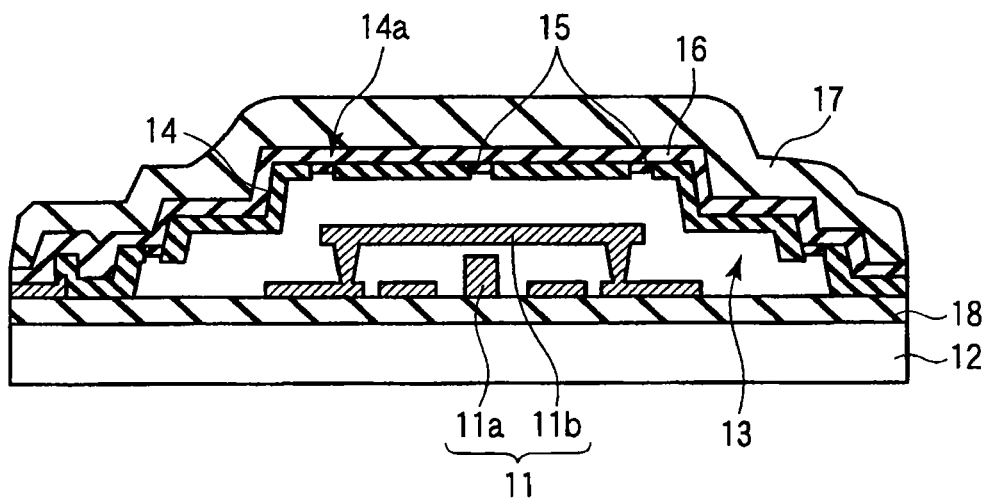
FIG. 8 is a cross-sectional view depicting a principle of the manufacturing process of the electrical device of the second embodiment.
FIG. 9 is a view depicting characteristics of materials to be applied to the electrical device of the invention.

That is, as shown in FIG. 8, the second films 15 are formed only in the through-holes 14a of the first film 14, and the third film 16, for example, composed of the silicon nitride film is formed on the first film 14 and the second film 15. The fourth film 17, for example, composed of epoxy resin is formed on the third film 16.

A manufacturing method of the second embodiment will be described with reference to FIG. 7A to FIG. 8.

As shown in FIG. 7A, after removing the first and the second sacrificial films 41, 42 through the through-holes 14a of the first film 14, the second films 15 are formed on the first film 14. The second films 15 are coating-type organic materials, for example, ultraviolet-curable epoxy resins. The balance between surface tension of the material itself and at an internal and external pressure difference of the through-holes 14a and the cavity 13 prevents the second film 15 from intruding into the cavity 13. Therefore, even in a structure in which the through-holes 14a are formed on the functional element 11, the coating-type organic material is not formed in a film manner on the functional element 11.

As shown in FIG. 7B, By using a dry process such as a chemical dry etching (CDE) method and the RIE method, the second film is applied with etching, and the second films 15 are left only in the through-holes 14a of the first film 14. In this way, the through-holes 14a are sealed by the second films 15.

In the sealing process, it is possible to evacuate the cavity 13 and to fill in the cavity 13 with an inactive gas.

After this, as shown in FIG. 7C, the third film 16 is formed on the first film 14 and the second films 15. The third film 16 is formed as the silicon nitride film, for example, in a low-temperature plasma CVD method, for example, with a film thickness of several μm to 10 μm. The third film 16 is not limited to the silicon nitride film (AlN), and by using a method such as an ink jet method, it is possible to use a ceramic material such as an aluminum nitride film. In this way, covering the first film 14 and the second films 15 with the third film 16 enables preventing the intrusion of water vapor and dust into the cavity 13, and enables preventing adverse affects on the functional element 11.

If it is necessary, to secure an opening part for an electrode pad, the third film 16 may be patterned.

After this, as shown in FIG. 8, epoxy resin having a thickness, for example, of about 100 μm is coated on the third film 16 and the third film is cured. Thereby, the insulating fourth film 17 for protecting the third film 16 and having elasticity is formed.

According to the second embodiment, the second films 15 composed of the coating-type organic material are formed only in the through-holes 14a of the film 14 which is composed of the inorganic film. That is, as shown in FIG. 9, the epoxy resin as a coating-type organic material having a coefficient of thermal expansion (CTE) which is larger than that of the silicon oxide film and the silicon nitride film and having a Young's modulus which is smaller than that of the silicon oxide film and the silicon nitride film is formed only in the through-holes 14*a*. Therefore, since a volume of the epoxy resin which is extremely different in Young's modulus and CTE from the silicon oxide film and the silicon nitride film may be dramatically reduced, it is possible to prevent an occurrence of cracks in the silicon oxide film and the silicon nitride film due to the heat in process, and peeling off of the films. Accordingly, the reliability of the cavity 13 may be improved.

Modified Example

Figure 10:
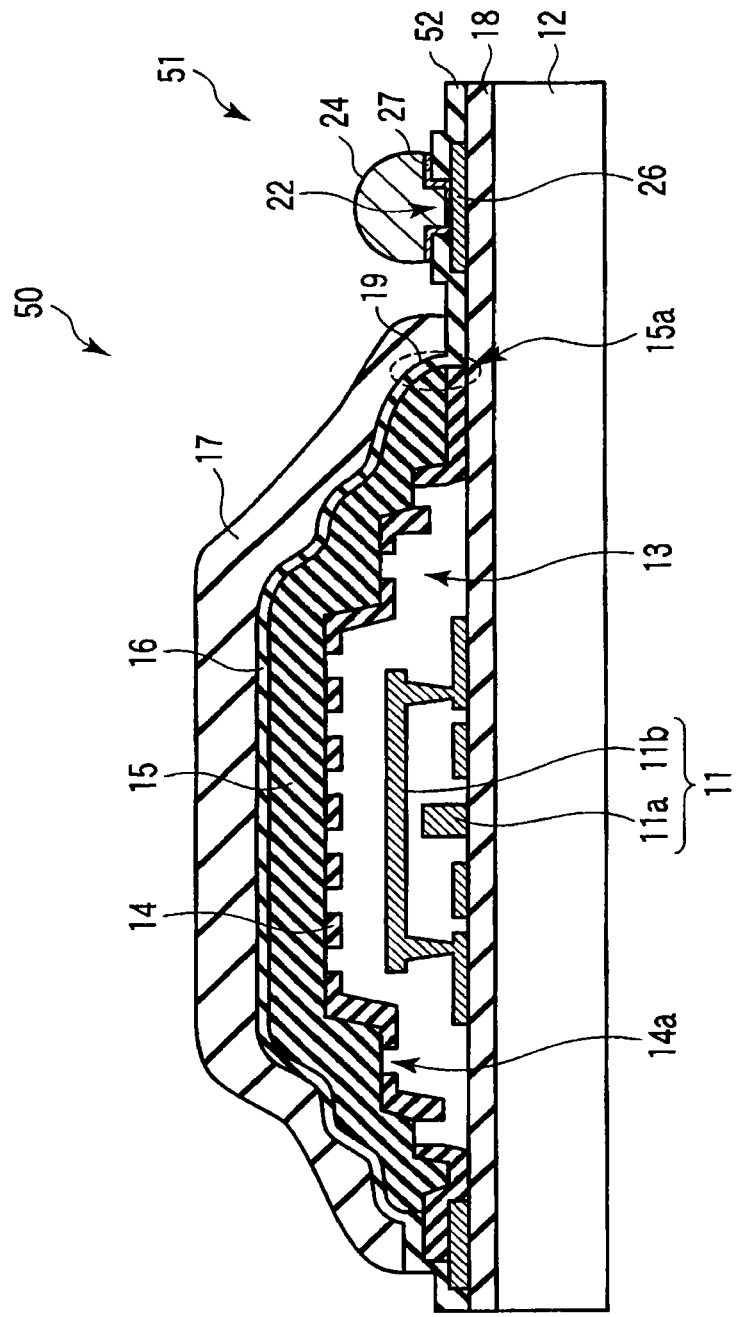
FIG. 10 is a cross-sectional view depicting an electrical device having another electrode unit of an embodiment of the invention.
Figure 11:
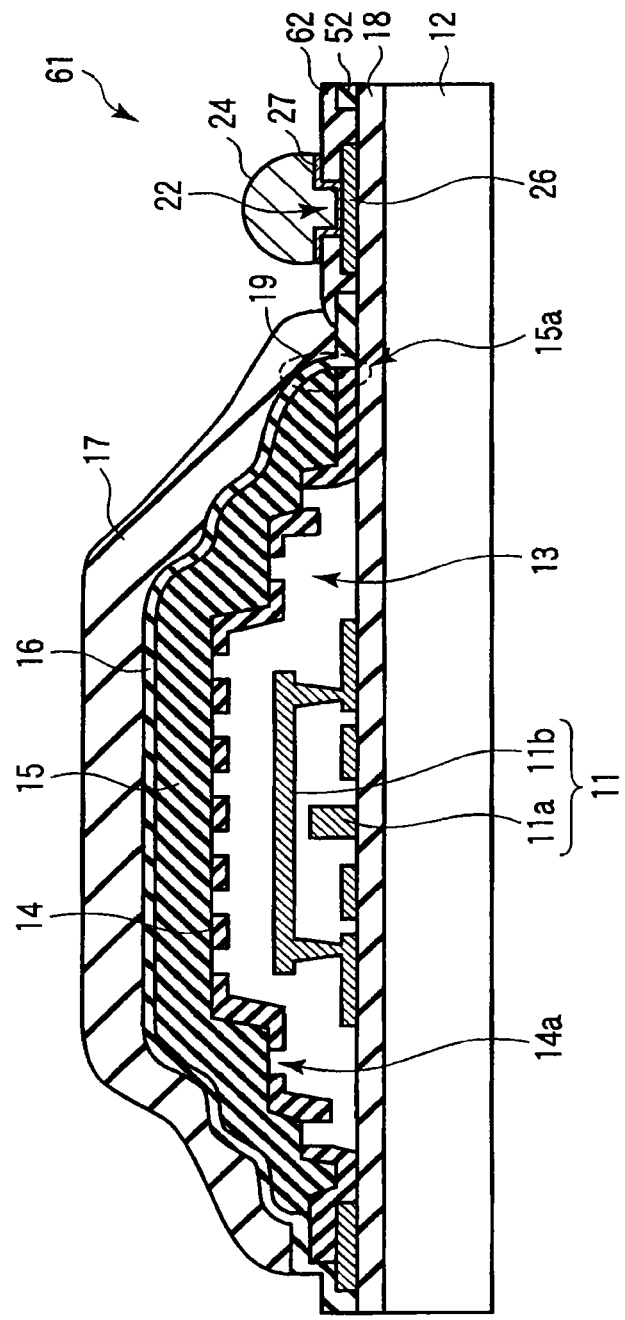
FIG. 11 is across-sectional view depicting an electrical device having another electrode unit of the embodiment of the invention.
Figure 12:
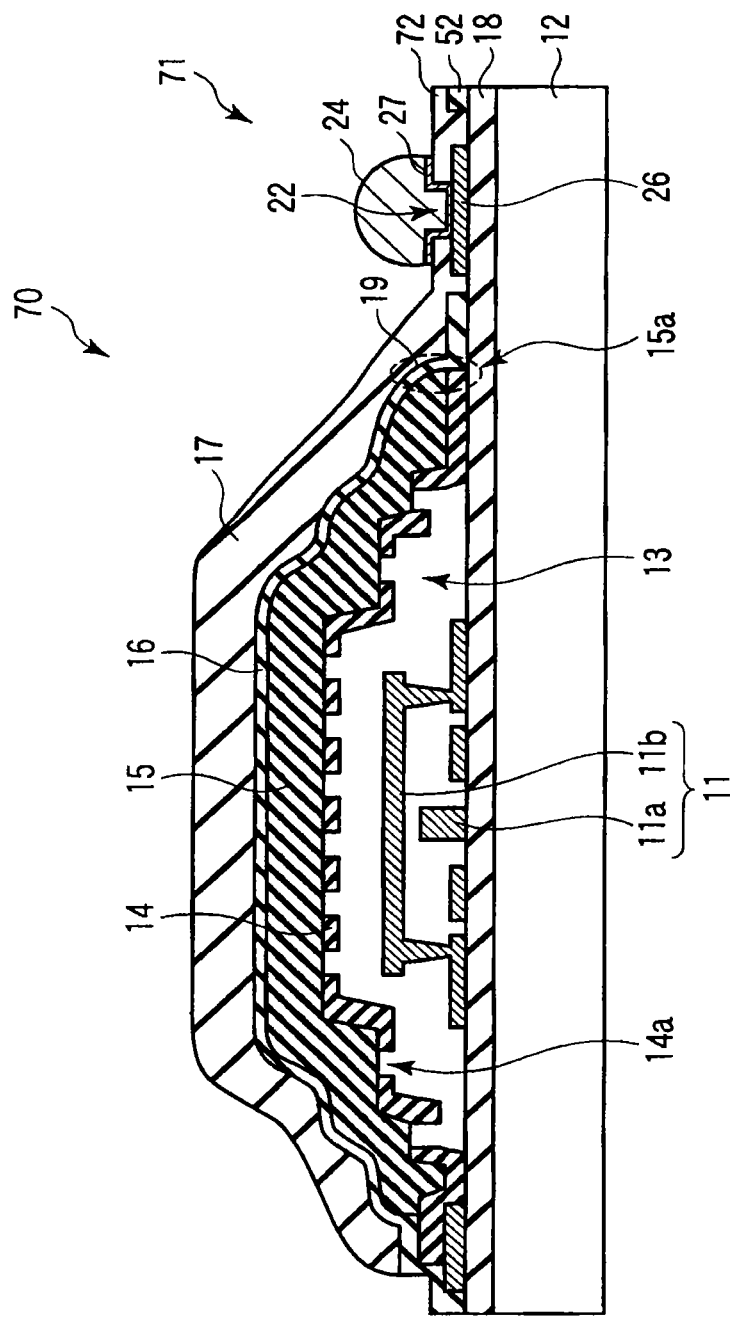
FIG. 12 is a cross-sectional view depicting an electrical device having another electrode unit of the embodiment of the invention.

FIGS. 10 to 12 each show modified embodiments of the electrode unit 20 shown in FIG. 1, and are cross-sectional views illustrating structures not having insulating films 25. However, the wirings 21 are omitted in the views.

In an electrode unit 51 of an electrical device 50 shown in FIG. 10, insulating film 52 of the same kind as that of the third film 16 is formed on the pad 26 to be continuous to the third film 16. The insulating film 52 has the opening 22 reaching the pad 26, and the metallic film 27 is formed in the opening 22. Further, the bump 24 is formed on the metallic film 27.

In an electrode unit 61 of an electrical device 60 shown in FIG. 11, organic film 62 of the same kind as that of the second film 15 is formed on the pad 26 so as to contact the fourth film 17. The organic film 62 has the opening 22 reaching the pad 26, and the metallic film 27 is formed in the opening 22. Further, the bump 24 is formed on the metallic film 27.

In an electrode unit 71 of an electrical device 70 shown in FIG. 12, the organic film 72 of the same kind as that of the fourth film 17 is formed on the pad 26 to be continuous to the fourth film 17. The organic film 72 has the opening 22 reaching the pad 26, and the metallic film 27 is formed in the opening 22. Further, the bump 24 is formed on the metallic film 27.

As mentioned above, in each electrode unit 20, 51, 61, 71, if the organic films of the same kinds as those of the second films 15 are not formed to be continuous to the second films 15, the structure of the electrode unit may vary.

According to the structures shown in FIGS. 10 to 12, even when the insulating film 52, and the organic films 62, 72 have cracked from the edges of the metallic films 27 each overlapped to the insulating film 52, and the organic films 62, 72, and the harmful gases such as water vapor enter from the cracks, the electrical devices 50, 60, 70 each may prevent the harmful gases such as water vapor from dispersing in the second films 15 and intruding into the cavity 13.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electrical device, comprising:
a functional element formed above a substrate, the functional element comprising a movable part capable of moving;
an insulating first film formed above the functional element to have a space between the first film and the movable part, the first film including a plurality of through-holes, and comprising an inorganic film;
an insulating second film formed above the insulating first film, and straddling the through-holes;
an insulating third film formed above the insulating second film; and
an insulating fourth film formed above the insulating third film, the fourth film comprising an organic film,
wherein a water permeability of the second film is higher than that of the third film.

2. The device of claim 1, wherein
the first film is a silicon compound consisting mainly of Si—O bonds,
the second film is a resin,
the third film is a silicon compound consisting mainly of Si—N bonds, and
the insulating fourth film is a resin.

3. The device of claim 1, wherein the third film comprises aluminum.

4. The device of claim 1, wherein the second film is configured to cover the plurality of the through-holes.

5. The device of claim 1, further comprising an insulating fifth film configured to cover a side surface of the second film and comprising an inorganic film.

6. The device of claim 5, wherein the fifth film and the third film are films formed of the same material.

7. The device of claim 5, further comprising an electrode formed outside the second film.

8. The device of claim 1, wherein the fourth film is one of an epoxy resin and a polyimide resin.

9. The device of claim 1, wherein shapes of the through-holes are taper shapes.

10. The device of claim 1, further comprising a sixth film formed between the second film and the third film.

11. The device of claim 10, wherein the sixth film is a oxide film.

12. The device of claim 1, further comprising:
a wiring provided outside of the space; and
a bump provided above the wiring, the bump being electrically connected to the wiring,
wherein the third film is extended outside of the space, the third film includes an opening corresponding to the wiring.

13. The device of claim 12, further comprising a metal film provided between the bump and the wiring.

14. The device of claim 12, wherein the metal film adheres to the bump and wiring.

15. The device of claim 1, further comprising:
a wiring provided outside of the space; and
a bump provided above the wiring, the bump being electrically connected to the wiring,
wherein the fourth film is extended outside of the space, the fourth film includes an opening corresponding to the wiring.

16. The device of claim 15, further comprising a metal film provided between the bump and the wiring.

17. The device of claim 16, wherein the metal film adheres to the bump and wiring.

18. The device of claim 1, wherein the movable part has a conductive material.

19. An electrical device, comprising:
a functional element formed above a substrate, the functional element comprising a movable part capable of moving;

an insulating first film formed above the functional element to have a space between the first film and the movable part, the first film including a plurality of through-holes, and comprising an inorganic film;
an insulating second film formed above the insulating first film, and provided in the through-holes, the second film straddling the through-holes; and
an insulating third film formed above the insulating second film,
wherein a water permeability of the second film is higher than that of the third film.

20. The device of claim 19, wherein
the first film is a silicon compound consisting mainly of Si—O bonds,
the second film is a resin,
the third film is a silicon compound consisting mainly of Si—N bonds, and
an insulating fourth film, formed above the insulating third film, is a resin.

21. The device of claim 19, wherein the third film comprises aluminum.

22. The device of claim 19, wherein the second film is configured to cover the plurality of the through-holes.

23. The device of claim 19, further comprising an insulating fifth film configured to cover a side surface of the second film and comprising an inorganic film.

24. The device of claim 23, wherein the fifth film and the third film are films formed of the same material.

25. The device of claim 23, further comprising an electrode formed outside the second film.

26. The device of claim 19, wherein an insulating fourth film, formed above the third insulating film, is one of an epoxy resin and a polyimide resin.

27. The device of claim 19, wherein shapes of the through-holes are taper shapes.

28. The device of claim 19, further comprising a sixth film formed between the second film and the third film.

29. The device of claim 28, wherein the sixth film is a oxide film.

30. The device of claim 19, further comprising:
a wiring provided outside of the space; and
a bump provided above the wiring, the bump being electrically connected to the wiring,
wherein the third film is extended outside of the space, the third film includes an opening corresponding to the wiring.

31. The device of claim 30, further comprising a metal film provided between the bump and the wiring.

32. The device of claim 31, wherein the metal film adheres to the bump and wiring.

33. The device of claim 19, further comprising:
a wiring provided outside of the space; and
a bump provided above the wiring, the bump being electrically connected to the wiring,
wherein an insulating fourth film, formed above the third insulating film, is extended outside of the space, the fourth film includes an opening corresponding to the wiring.

34. The device of claim 33, further comprising a metal film provided between the bump and the wiring.

35. The device of claim 34, wherein the metal film adheres to the bump and wiring.

36. The device of claim 19, wherein the movable part has a conductive material.

37. An electrical device, comprising:
a functional element formed above a substrate, the functional element comprising a movable part capable of moving;
an insulating first film formed above the functional element to have a space between the first film and the movable part, the first film including a plurality of through-holes, and comprising an inorganic film;
an insulating second film formed above the insulating first film, and straddling the through-holes; and
an insulating third film formed above the insulating second film, the third film comprising an organic film.

* * * * *